United States Patent
Gaide et al.

(10) Patent No.: US 10,741,524 B2
(45) Date of Patent: Aug. 11, 2020

(54) REDUNDANCY SCHEME FOR A 3D STACKED DEVICE

(71) Applicant: Xilinx, Inc., San Jose, CA (US)

(72) Inventors: Brian C. Gaide, Erie, CO (US); Matthew H. Klein, Redwood City, CA (US)

(73) Assignee: XILINX, INC., San Jose, CA (US)

(*) Notice: Subject to any disclaimer, the term of this patent is extended or adjusted under 35 U.S.C. 154(b) by 34 days.

(21) Appl. No.: 15/967,109

(22) Filed: Apr. 30, 2018

(65) Prior Publication Data

US 2019/0333892 A1 Oct. 31, 2019

(51) Int. Cl.
| | |
|---|---|
| H01L 25/065 | (2006.01) |
| H01L 23/535 | (2006.01) |
| H01L 21/66 | (2006.01) |
| H01L 25/00 | (2006.01) |

(52) U.S. Cl.
CPC .......... *H01L 25/0652* (2013.01); *H01L 22/10* (2013.01); *H01L 23/535* (2013.01); *H01L 25/50* (2013.01)

(58) Field of Classification Search
USPC .......................................................... 716/131
See application file for complete search history.

(56) References Cited

U.S. PATENT DOCUMENTS

| | | | | |
|---|---|---|---|---|
| 2013/0176763 | A1* | 7/2013 | Ware | G11C 29/808 |
| | | | | 365/51 |
| 2014/0062587 | A1* | 3/2014 | Koyanagi | G06F 3/0688 |
| | | | | 327/595 |

* cited by examiner

*Primary Examiner* — Eric D Lee
(74) *Attorney, Agent, or Firm* — Patterson + Sheridan, LLP

(57) ABSTRACT

Examples herein describe techniques for forming 3D stacked devices which include a redundant logical layer. The 3D stacked devices include a plurality of semiconductor chips stacked in a vertical direction such that each chip is bonded to a chip above, below, or both in the stack. In one embodiment, each chip is the same—e.g., has the same circuitry arranged in the same configuration in the chip. The 3D stacked device provides a redundant logic layer by dividing the chips into a plurality of slivers which are interconnected by inter-chip bridges. For example, the 3D stacked device may include three stacked chips that are divided into three different slivers where each sliver includes a portion from each of the chips. So long as only one of portions in a sliver is nonfunctional, the inter-chip bridges permit the other portions in the sliver to receive and route data.

16 Claims, 6 Drawing Sheets

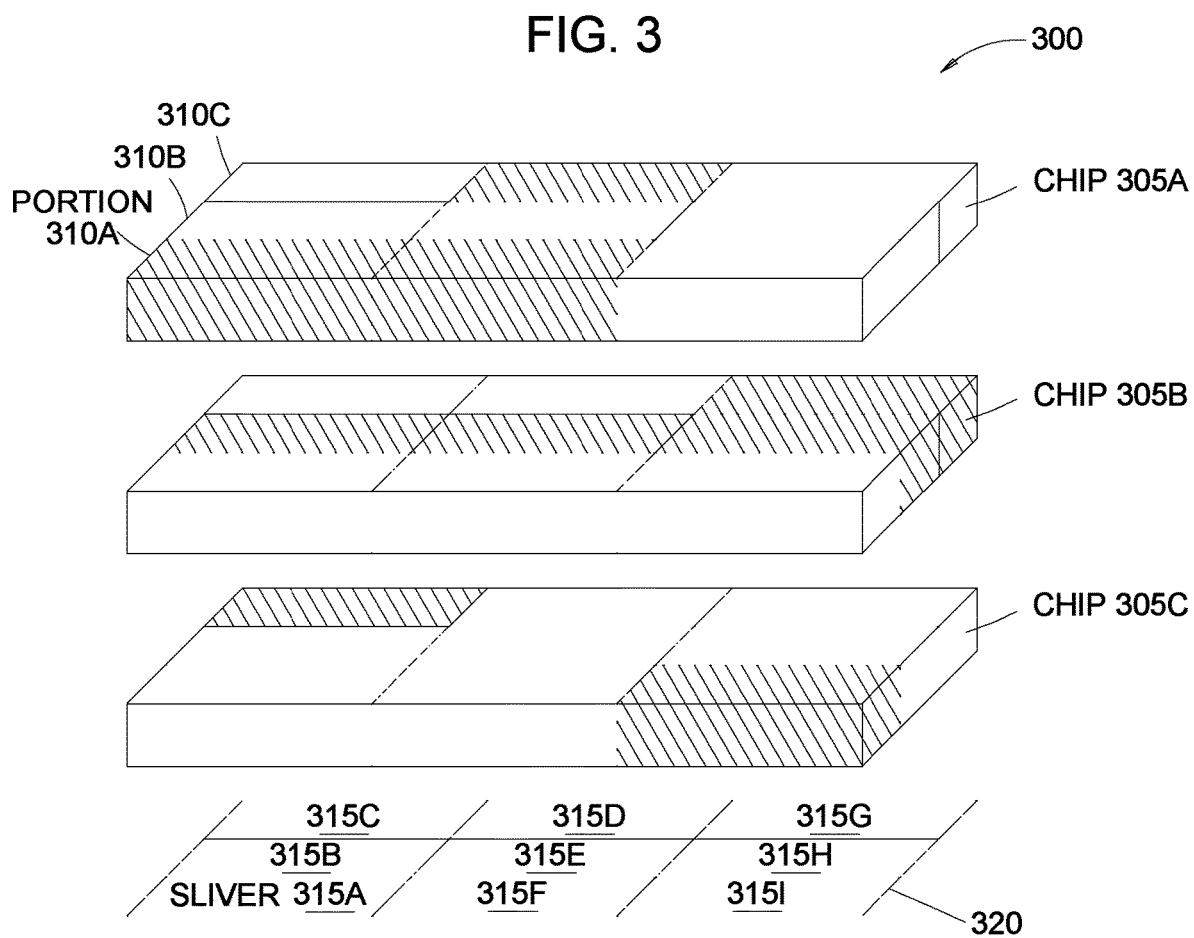

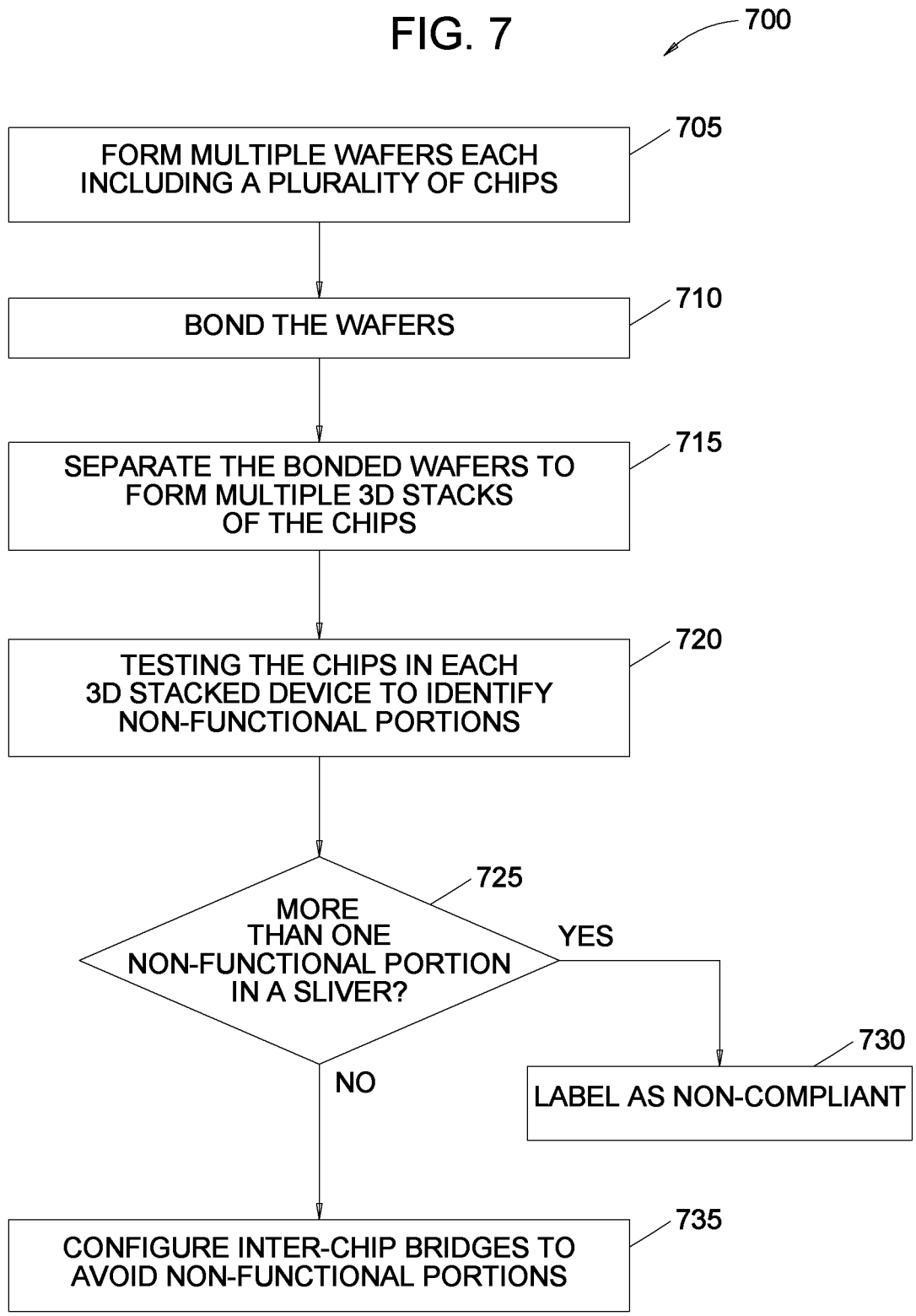

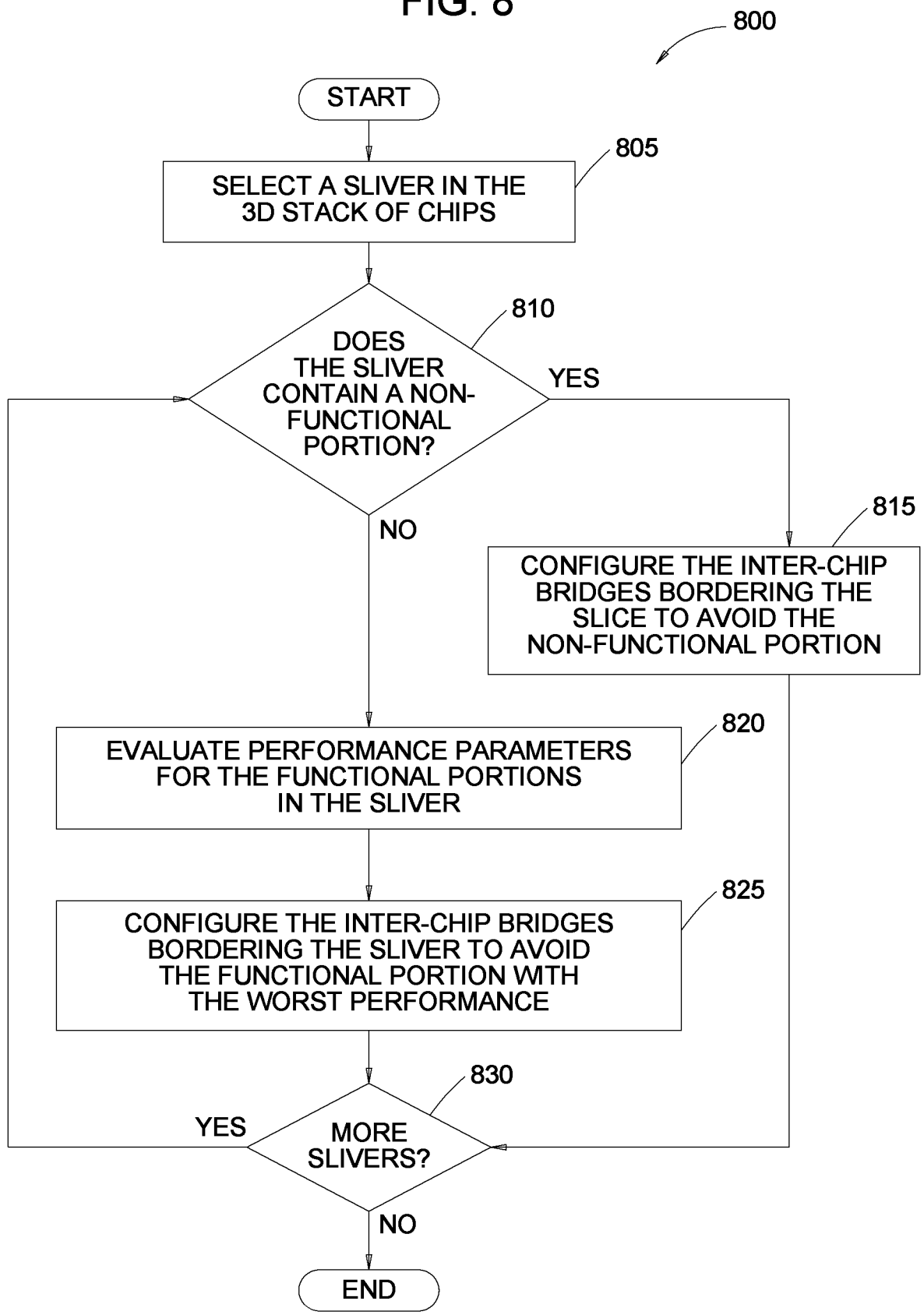

REDUNDANCY SCHEME FOR A 3D STACKED DEVICE

TECHNICAL FIELD

Examples of the present disclosure generally relate to providing redundancy in a 3D stacked device containing a plurality of chips.

BACKGROUND

Field programmable gate arrays (FPGAs) can be packaged to form a 2.5D package where the FPGAs are disposed onto a common substrate or interposer. That is, the FPGAs are bonded in a side-by-side manner to the same surface of the interposer. The interposer is typically passive (e.g., does not include active components such as transistors) includes data paths for coupling the FPGAs to each other. Further, the package may include an extra or redundant FPGA to improve yield. That is, due to a manufacturing defect, one of the FGPAs may be nonfunctional. As a result, the package may include four FPGAs but advertise that it is a three-FPGA system with a redundant FPGA. So long as only one FPGA in the package has a defect (which cannot be determined until the FPGAs have been mounted on the interposer and tested), the package can be sold as a three-FPGA system. If after testing reveals that multiple FPGAs are defective, the package may be discarded or sold as a different system.

SUMMARY

Techniques for configuring a 3D stacked device to provide at least one redundant logical layer are described. One example is a 3D stacked device that includes a plurality of semiconductor chips stacked vertically on each other where each of the plurality of chips is logical divided into the same of number of portions, and where each of the portions in the same chip is separated from a neighboring portion by an inter-chip bridge. A respective portion from each of the plurality of chips in a column are grouped together to form a first sliver where the respective portions in the first sliver comprise a deactivated portion and a first active portion. At least one inter-chip bridge bordering the first sliver is configured to route data from a second active portion in a neighboring sliver to the first active portion in the first sliver where the second active portion is in the same chip as the deactivated portion but in a different chip from the first active portion.

One example described herein is a method for configuring a 3D stacked device including a plurality of semiconductor chips stacked vertically on each other. The method includes testing a plurality of portions in each of the plurality of chips, where the plurality of chips are logically divided into the same number of portions, and where each of the portions in the same chip is separated from a neighboring portion by an inter-chip bridge. The method includes identifying at least one nonfunctional portion in a first sliver, wherein the first sliver comprises a respective portion from each of the plurality of chips in a column, where the sliver comprises a first active portion in addition to the nonfunctional portion. The method also includes configuring at least one inter-chip bridge bordering the first sliver to route data from a second active portion in a neighboring sliver to the first active portion in the first sliver, where the second active portion is in the same chip as the nonfunctional portion but in a different chip from the first active portion.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIG. 3 is a 3D stacked device with a redundant layer, according to one embodiment.

FIG. 7 is a flowchart for forming 3D stacked devices with a redundant layer, according to one embodiment.

FIG. 8 is a flowchart for configuring the inter-chip bridges in the chips of a 3D stacked device, according to one embodiment.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
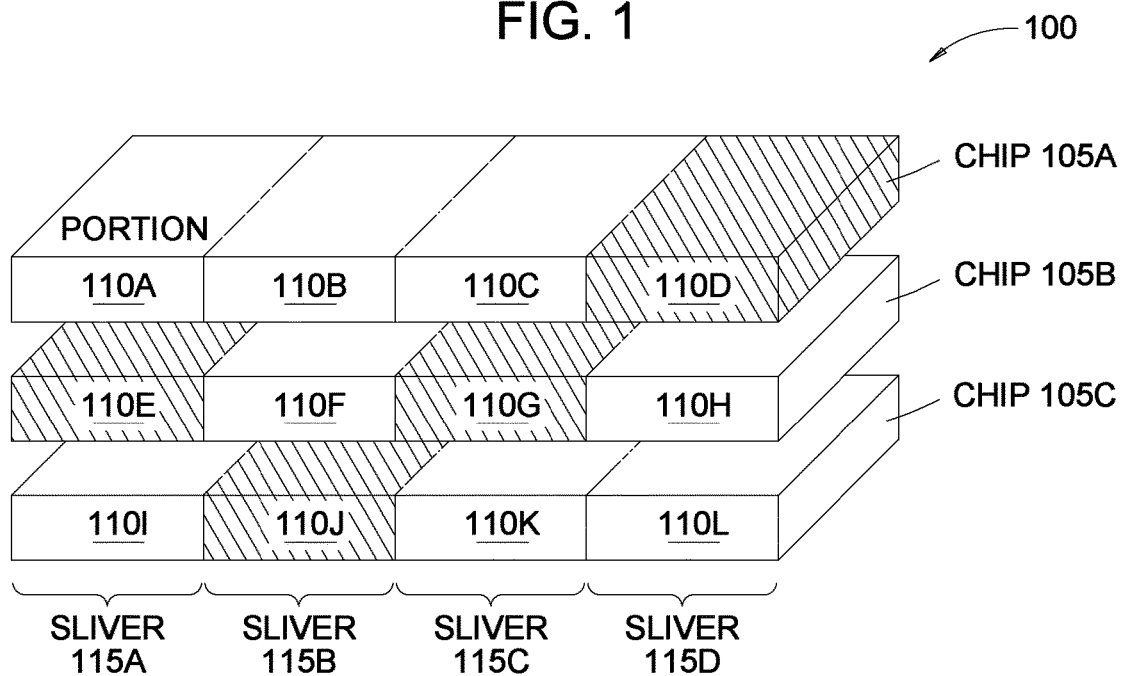
FIG. 1 is a 3D stacked device with a redundant layer, according to one embodiment.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for forming 3D stacked devices that include a redundant logical layer. The 3D stacked devices include a plurality of semiconductor chips stacked in a vertical direction such that each chip is bonded to a chip above, below, or both in the stack. In one embodiment, each chip is the same—e.g., has the same circuitry arranged in the same configuration in the chip. The chips could be FPGAs, memory devices (e.g., DRAM or SRAM chips), processors, accelerators, systems on a chip (SoC), and the like.

In one embodiment, the 3D stacked device provides a redundant logical layer by dividing the chips into a plurality of slivers which are interconnected by inter-chip bridges. For example, the 3D stacked device may include three stacked chips that are divided into three different slivers where each sliver includes a portion from each of the chips. So long as only one of portions in a sliver has a defect (or is nonfunctional), the inter-chip bridges permit the other portions in the sliver to receive and route data. In this redundancy scheme, multiple chips can have defects and still provide two logical layers that are equivalent to two functional chips. Put differently, although more than one of the three chips in the stack may include nonfunctional portions, so long as the portions are in different slivers, the inter-chip bridges can couple together the chips such that it appears to an outside application that the 3D stack has two fully functional chips.

The 3D stacked device described herein has several advantages over a 2.5D package since it does not require an interposer (whether passive or active) and avoids significant delay penalties when crossing from one die to the next. Further, a 2.5D package may require a user to partition their design due to having relatively fewer inter-die connections when compared to a 3D stacked device.

FIG. 1 is a 3D stacked device 100 with a redundant layer, according to one embodiment. In this example, the device 100 includes three different semiconductor chips 105 that are the same. That is, the chips 105 may be three of the same FPGAs, memory devices, processors, SoC, and the like. Although three chips 105 are shown, the device 100 can have two, four, five, or six chips. For clarity, the chips 105 are shown as being spaced apart, but in operation are bonded together to establish physical connections and communication paths between the chips 105. For example, solder bumps or other communication means can be used to enable the chips 105 to communicate. Further, the chips 105 may be encased in a protective material, e.g., an epoxy to provide further structural support and protection when being packaged.

Each chip 105 is divided into four portions 110. The portions 110 illustrated in FIG. 1 are logical divisions of the chip rather than physical divisions. The portions 110 are then grouped into respective slivers 115 according to the column they lie in. For example, the portion 110A in the chip 105A, the portion 110E in the chip 105B, and the portion 110I in the chip 105C form the sliver 115A. The portion 110B in the chip 105A, the portion 110F in the chip 105B, and the portion 110J in the chip 105C form the sliver 115B, and so forth. Because the chips 105 are the identical chips, the circuitry and its arrangement in each portion 110 in each sliver 115 is identical. That is, the portions 110A, 110E, and 110I include the same circuitry and arrangement, the portions 110B, 110F, and 110J include the same circuitry and arrangement, and so forth. As such, the portions 110 in the same sliver 115 may perform identical functions, and thus, can be considered as redundant portions.

In one embodiment, every portion 110 in all the chips 105 is the same. That is, the portions 110A-110L may include the same circuitry and arrangement. For example, if the chips 105 are FPGAs, the portions 110 may include circuitry which is repeated four times in each chip 105. In another example, the portions 110 may each include a processor, the same set of programmable logic, or the same amount of memory cells. In this embodiment, the slivers 115 are identical to each other.

The division between the portions 110 and slivers 115 may be based on any number of logical boundaries such as a boundary between two clock domains, a boundary between two voltage domains, a boundary between two different types of circuitry or logic blocks, and the like. Although not shown here, the chips 105 include inter-chip bridges disposed at the boundary between each portion 110 in the chips 105 which enable the portions to talk to a neighboring portion 110 in the same chip 105 or to a portion in a neighboring chip 105.

The hashing in FIG. 1 illustrates portions 110 of the chips 105 that are deactivated or are nonfunctional. In this example, during operation, the portions 110D, 110E, 110G, and 110J are not used while the portions 110A, 110B, 110C, 110F, 110H, 110I, 110K, and 110L are used. The deactivated portions 110 may be deactivated because they are nonfunctional (e.g., due to a manufacturing defect) or because they are redundant. For example, the portion 110D may include a manufacture defect that makes it nonfunctional; however, the portions 110E, 110G, and 110J may be functional but are deactivated because they are redundant. That is, although the 3D stacked device 100 includes three chips 105, if anyone of the chips 105 includes a nonfunctional portion 110, the 3D stacked device 100 performs as if it includes two functional chips 105. Put differently, although the 3D stacked device 100 includes three chips 105, it may be advertised as having at least two functional chips 105 and one redundant chip 105. If during testing, all the portions 110 in all the chips 105 are functional, then all the portions 110 may be active.

For simplicity, it is assumed that the deactivated portions 110 in FIG. 1 include manufacturing defects that make these portions nonfunctional. For example, after the chips 105 are bonded together, testing the chips 105 indicates that the portions 110D, 110E, 110G, and 110J are nonfunctional. Thus, unlike other redundancy schemes where N+1 redundancy is achieved only when a single chip has an error, here, two or three of the chips 105 can include errors and still function as two fully functional chips. Because none of the slivers 115 have more than one nonfunctional or deactivated portion, this means each sliver 115 has two functional or active portions 110. As described in detail below, the two active portions in each sliver 115 can be interconnected using the inter-chip bridges so that the device 100 performs equivalent to a device that has two fully functional chips (e.g., two chips with no nonfunctional or deactivated portions). That is, the portions 110A and 110I in the sliver 115A are communicatively coupled to the active portions 110B and 110F in the sliver 115B which in turn are communicatively coupled to the active portions 110C and 110K in the sliver 115C, and so forth. Because the portions 110 in each sliver are homogeneous, it does not matter which two of the three portions 110 are active (so long as they are functional). That is, to the perspective of the portion 110F, it does not matter whether it transmits and receives data with the portion 110G (which is in the same chip 105B) or the portion 110K (which is in the neighboring chip 105C). Thus, the active portions 110 in FIG. 1 can be communicatively coupled to perform the same function as two completely functional chips 105.

Figure 2:
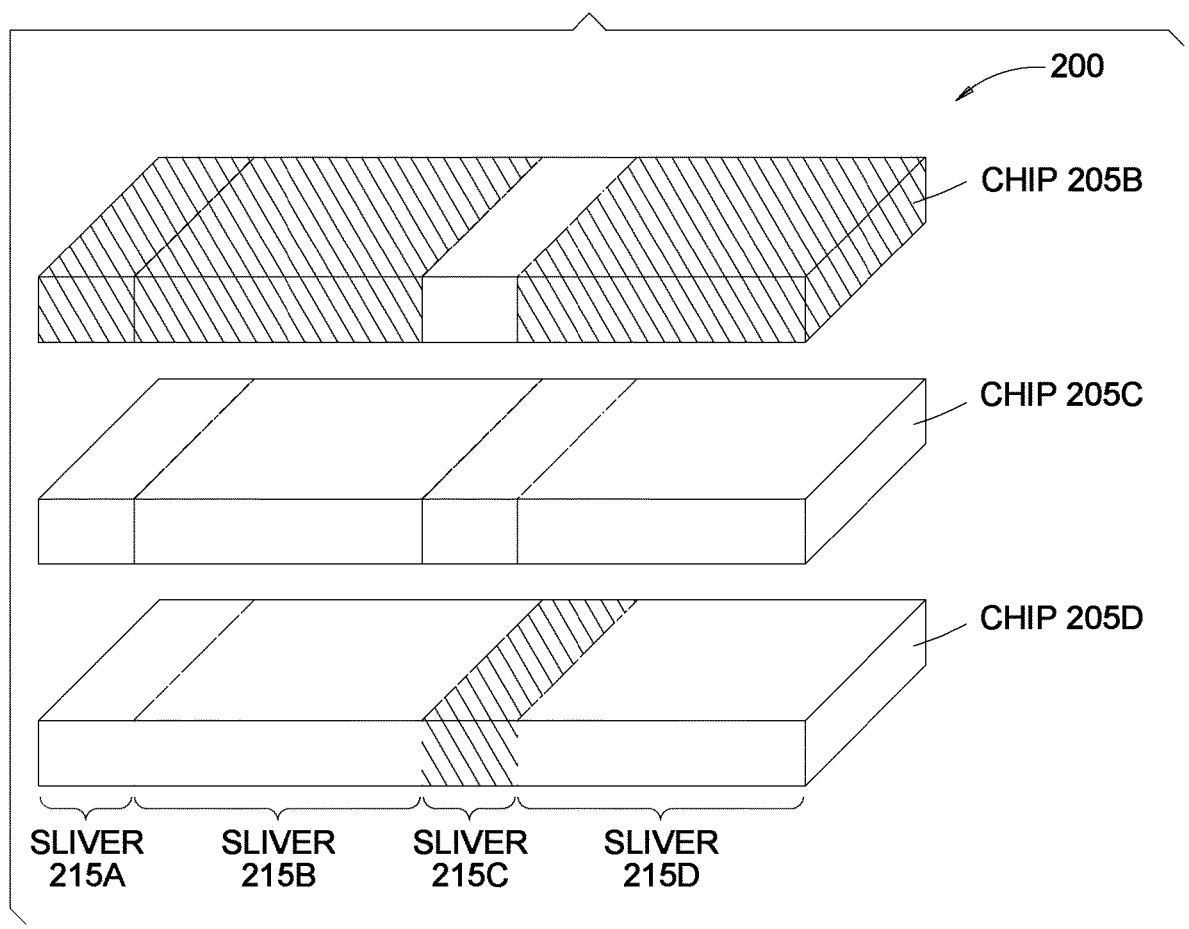
FIG. 2 is a 3D stacked device with a redundant layer, according to one embodiment.

FIG. 2 is a 3D stacked device 200 with a redundant layer, according to one embodiment. As above, the 3D stacked device 200 includes three homogeneous chips 205. However, the logical division of the chips 205 into the portions (not labeled) and slivers 215 are different. That is, rather than the slivers having the same widths (or the same sized portions), the slivers 215 have different sized portions. Like in the 3D stacked device 100, the portions in each sliver 215 may be the same (e.g., the same circuitry and arrangement) but the slivers 215 may include different portions. That is, the circuitry in the portions 110 in the respective slivers may be different. For example, the portions 110A, 110E, and 110I in the sliver 115A may include processors and associated memory while the portions 110B, 110F, and 110J in the sliver 115B may include programmable logic arranged in one or more configuration logic blocks. In this example, the slivers 115A and 115B are heterogeneous although the respective portions 110 within each of the slivers 115 are homogeneous. Further, the boundaries between the portions 110 and slivers 115 may be based on any number of logical boundaries such as a boundary between two clock domains, a boundary between two voltage domains, a boundary between two different types of circuitry, and the like.

So long as only one of the portions in each of the slivers 215 is deactivated (as shown by the hashing), the 3D stacked device 200 can function the same as two fully functional chips 205. Being able to divide the chips 205 into smaller and smaller slivers 215 increases the chance that each sliver contains at most one nonfunctional or deactivated portion. However, forming additional slivers 215 may be limited by the number of suitable boundaries for dividing the slivers 215, as well as the space used by adding the circuitry and structures for the inter-chip bridges at those boundaries.

FIG. 3 is a 3D stacked device 300 with a redundant layer, according to one embodiment. FIG. 3 illustrates logically dividing the device 300 into a 2D array 320 of slivers 315. That is, instead of columns as shown in FIGS. 1 and 2, multiple portions 310 can be formed in each column and row in the chips 305. That is, the chips 305 may include suitable boundaries that extend in two directions on the chips 305 so that the chips 305 can be divided into the portions 310.

The portions 310 can then form the slivers 315 where each sliver 315 has at most one deactivated portion 310 (illustrated by the hashing). The portions 310 may include inter-chip bridges coupling the portion 310 to its respective neighboring portions in the same chip or neighboring chips. For example, the portion 310A can border inter-chip bridges which couple it to the east and north portions 310 in the chip 305A as well as to the corresponding portions 310 in the chip 305B. Similarly, the portion 310B includes inter-chip bridges coupling it to the north, east, and south portions 310 in the chip 305A as well as to the corresponding portions 310 in the chip 305B.

The 3D stacked device 300 may include a greater number, or density, of slivers 315 than the 3D stacked devices 100 and 200 for the same chip size which may increase the likelihood that at most one of the portions in each of the slivers 315 is nonfunctional, and thus, the 3D stacked device 300 can perform equivalent to two fully functional chips 305.

Figure 4A:
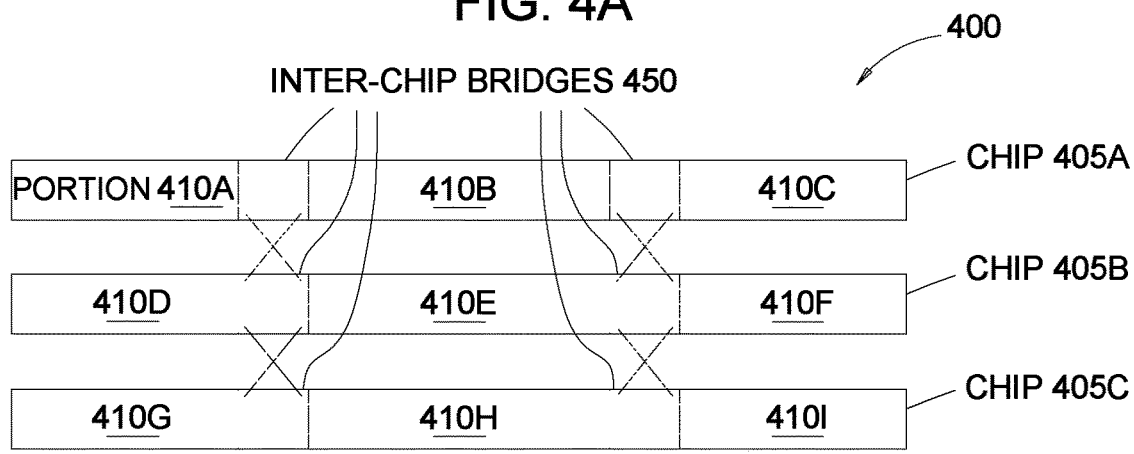
FIGS. 4A and 4B illustrate inter-chip bridges for avoiding a nonfunctional portion in a chip of a 3D stacked device, according to one embodiment.
Figure 4B:
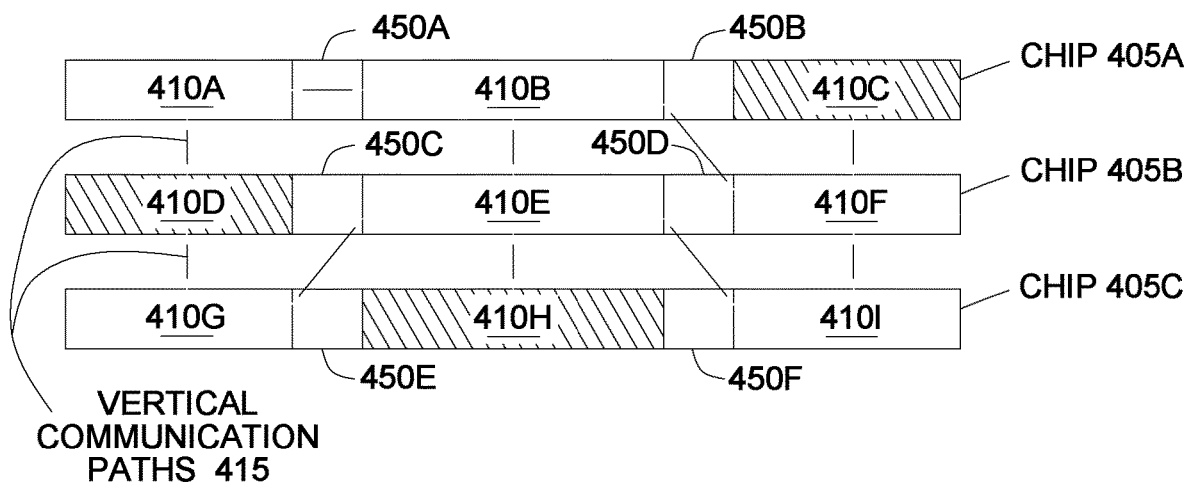

FIGS. 4A and 4B illustrate inter-chip bridges 450 for avoiding a nonfunctional portion in a chip of a 3D stacked device 400, according to one embodiment. FIG. 4A illustrates a side view or a cross section of the 3D stacked device 400 which illustrates respective inter-chip bridges 450 between each of the portions 410. Specifically, FIG. 4A illustrates the state of the 3D stacked device 400 before determining which of the portions 410 are nonfunctional, and thus, should be deactivated.

The double-headed dotted arrows indicate communication paths that can be facilitated by the inter-chip bridges 450 although only one of those paths may ultimately be selected. Put differently, the inter-chip bridges include circuitry and electrical paths (e.g., traces and vias) that permit each portion 410 to communicate with a neighboring portion 410 in the same chip and at least one neighboring portion in another chip 405. For example, the inter-chip bridge 450 between the portion 410A and 410B permits the portion 410A to communicate with the portion 410B which is in the same chip 405A as well as the portion 410F which is the different chip 405B. This same inter-chip bridge 450 permits the portion 410B to communicate with either the portion 410A or the portion 410D in the chip 405B. The inter-chip bridge 450 between the portion 410D and the portion 410F permits the portion 410D to communicate with the portion 410F in the same chip 405B, the portion 410B in the upper chip 405A, or the portion 410H in the lower chip 405C. That same inter-chip bridge 450 permits the portion 410F to communicate with the portion 410D, the portion 410A in the upper chip 405A, or the portion 410G in the lower chip 405G. In this embodiment, the inter-chip bridges 450 are bi-directional and permit data to flow in both directions.

FIG. 4B illustrates the state of the inter-chip bridges 450 when the 3D stacked device 400 is configured and the nonfunctional or deactivated portions 410 have been identified. In FIG. 4B, the solid double-headed arrows indicate the actual communication paths established by the inter-chip bridges 450 rather than the potential communication paths illustrated by the dotted arrows in FIG. 4A.

In FIG. 4B, the portions 410C, 410D and 410H are deactivated as shown by the hashing. For example, these portions 410 may have manufacturing defects which affect their operability. Because each sliver (i.e., each column in this example) include at most one deactivated portion 410, the 3D stacked device behaves the same as two fully functional chips 405.

The inter-chip bridges 450 are configured to provide communication paths around the deactivated portions 410. For example, because the portion 410D is deactivated, the inter-chip bridges 450C and 450E permit the portion 410G in the chip 405C to transmit data to, and receive data from, the portion 410E in the chip 405B. This permits the data flow to avoid the deactivated portion 410D as well as the deactivated portion 410H. Similarly, because the portion 410C is deactivated, the inter-chip bridges 450B and 450D couple the portion 410B to the portion 410F so they can transfer data. In turn, the inter-chip bridges 450D and 450F couple the portion 410E to the portion 410I in the chip 405C so they can share data. Thus, the inter-chip bridges 450 need only to provide a communication path to the next neighboring chip or chips (rather than to chips that may be two chips away in the device 400) to enable the active portions 410 to avoid the deactivated portions 410. Further, because the portions 410 in a sliver are homogeneous, it does not matter which of the portions are coupled to the neighboring portions. That is, the operation of the circuitry in the portion 410A is not affected or altered when it is communicatively coupled by the bridge 450A to the portion 410B instead of the portion 410E.

In addition to the communication paths provided by the inter-chip bridges 450, the 3D stacked device 400 includes vertical communication paths 415 that permit portions 410 in the same sliver to communicate. That is, while the inter-chip bridges 450 permit portions in one sliver to communicate with portions in a neighboring sliver (whether on the same chip or a different chip or chips), the vertical communication paths 415 permit the portions 410 in the same sliver to communicate. In one embodiment, the vertical communication paths 415 are unaffected by the deactivated portions 410. For example, although the portion 410D is inactive in FIG. 4B, the lower portion 410G can still use the vertical communication paths 415 to communicate with the upper portion 410A. For example, the vertical communication paths 415 may be passive vias that extend through all the portions 410A, 410D, and 410G. Thus, data transmitted on the vias by one of the portions 410 reaches the other two portions 410 regardless if one of those portions 410 is deactivated. In another example, the portions 410 may include separate receive and drive circuitry for relaying data using the vertical communication paths 415 which is unaffected when a portion 410 is deactivated. For example, although the portion 410D is deactivated, the driver and receiver circuitry for the paths 415 in the portion 410D may still be operational so that the portions 410A and 410G can communicate using the vertical communication paths 415. Thus, not all of the circuitry in a deactivated portion 410 may be unused.

Figure 5:
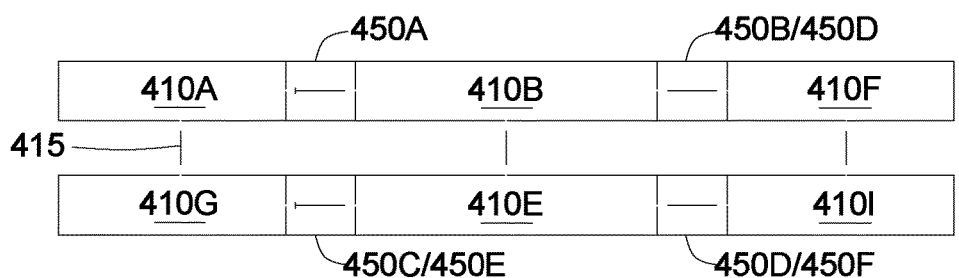
FIG. 5 is a logical view of the device illustrated in FIG. 4B, according to one embodiment.

FIG. 5 is a logical view of the device illustrated in FIG. 4B, according to one embodiment. That is, FIG. 5 illustrates the flow of data through the portions 410 without illustrating the locations of the portions 410 in the chips. As shown, the portion 410A communicates with the portion 410B using the inter-chip bridge 450A since these portions 410 are on the same chip. However, because the portion 410G and 410E are on different physical chips, they use two inter-chip bridges (i.e., bridges 450C and 450E) to facilitate communication. FIG. 5 illustrates that the portions 410 can be interconnected by the inter-chip bridges 450 to establish two logical chips that function the same as two fully functional physical chips which include the vertical communication paths 415 for permitting communication between portions 410 in the same slivers.

Figure 6:
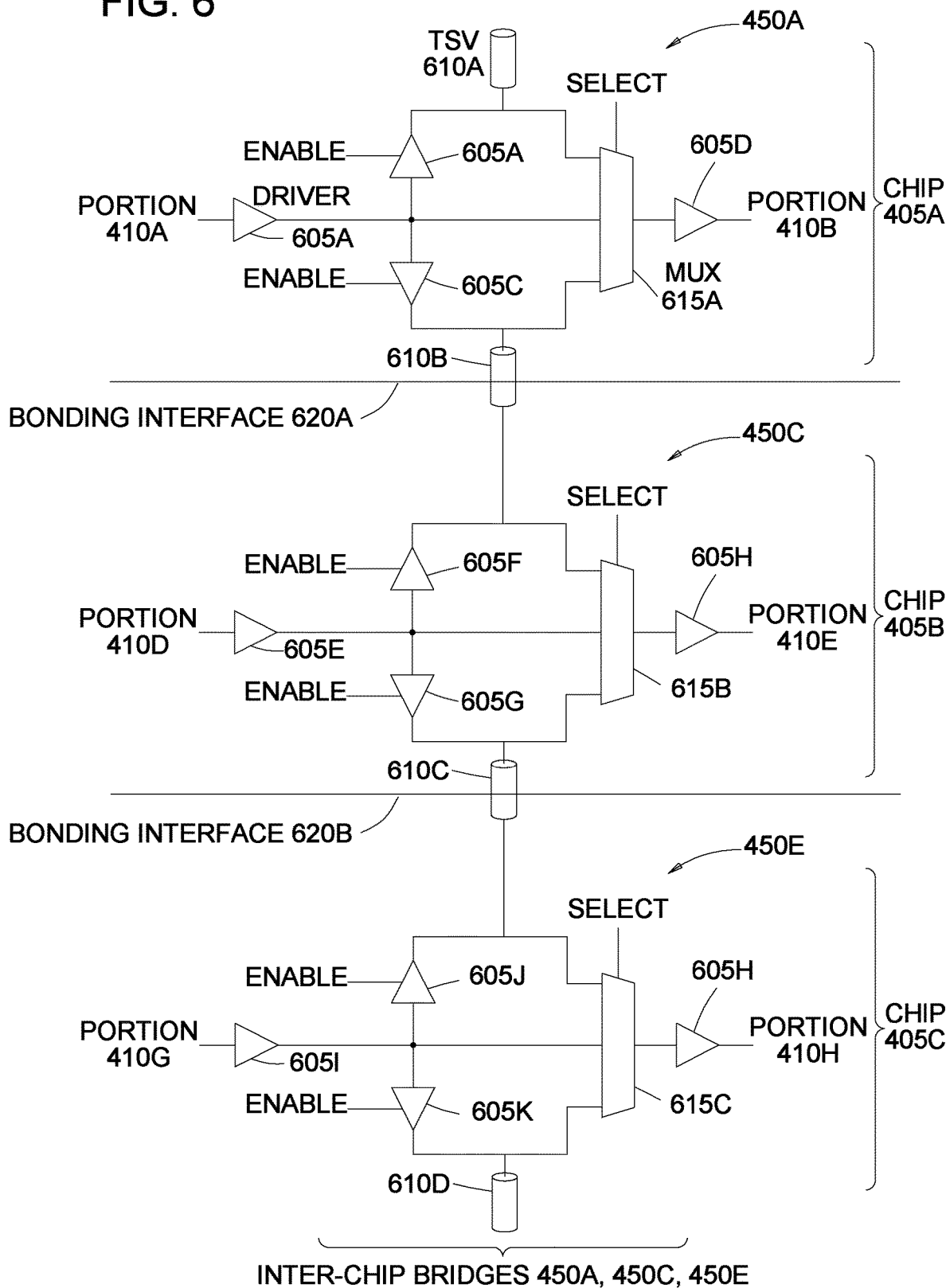
FIG. 6 illustrates circuitry in the inter-chip bridges, according to one embodiment.

FIG. 6 illustrates circuitry in the inter-chip bridges 450, according to one embodiment. Specifically, FIG. 6 illustrates the circuitry in the inter-chip bridges 450A, 450C, and 450E which enable communication between the left sliver (or column) in FIGS. 4A and 4B with the middle sliver (or column). FIG. 6 illustrates the circuitry used to transmit data from the portions 410 of the chips 405 in the left sliver to the portions 410 in the chips 405 in the middle sliver. That is, FIG. 6 illustrates the circuitry in the inter-chip bridge 450A that permits the portion 410A to transmit data to the portion 410B or to the portion 410E. In one embodiment, the inter-chip bridges 450A, 450C, and 450E include another copy of the circuitry shown here which permits each portion 410 in the middle sliver to transmit data to the portions 410 in the left sliver. For example, the inter-chip bridge 450B can include circuitry that is reversed relative to the arrangement in FIG. 6 so that the portion 410E can transmit data to the portion 410A, the portion 410D, or the portion 410G.

For simplicity, only the circuitry in the inter-chip bridge 450A is discussed in detail but this description applies to the other bridges 450. A driver 605A receives data from circuitry (not shown) in the portion 410A. This data is then provided to the inputs of a driver 605B, a driver 605C, and a multiplexer (mux) 615A. The driver 605B is used to route the data to a portion that is disposed in a chip above the chip that contains the portion 410A in the stack. However, because the portion 410A is in the topmost chip 405 in this example, the driver 605B may always be disabled (using the ENABLE signal which can be controlled by a configuration register) such that data is not transmitted to an upper chip using a through silicon via (TSV) 610A. However, in other embodiments, there may be another chip above the chip containing the portion 410A in which case the TSV 610A may be used. For example, an I/O or memory chip may be disposed on top of the chips 405 containing the portions 410 (which may be FPGAs) which may use the TSV 610 to transfer data between the I/O or memory chip and the FPGAs formed by the chips 405.

The output of the mux 615A is coupled to a driver 605D which is in turn coupled to the portion 410B. Using a SELECT signal, the mux 615A can choose what data is transmitted to the portion 410B. For example, referring to the example in FIG. 4B, the inter-chip bridge 450A is configured to transmit data from the portion 410A to the portion 410B. As such, the SELECT signal is selected so that the middle input of the mux 615A (which is coupled to the driver 605A) is outputted to the driver 605D and to the circuitry in the portion 410B.

The output of the driver 605C is coupled to a TSV 610B which communicatively couples the chip 405A to the chip 405B at the boundary interface 620A. Although not shown, the boundary interface 620 may include solder bumps or other connective material that couples the TSVs in the chip 405A to the TSVs in the chip 405B. When the portion 410A should transmit data to the portion 410E, the ENABLE signal activates the driver 605C so that data flows through the TSV 610B and to a mux 615B in the inter-chip bridge 450C. However, because in this example the portion 410A transmits data to the portion 410B, the ENABLE signals disable the drivers 605B and 605C. As such, data received at the driver 605A flows through the mux 615A and the driver 605D into the portion 410B. In one embodiment, the ENABLE and SELECT signals are independent signals (i.e., are not shared signals) so that the various circuitry coupled to these signals can be controlled independently.

Turning to the configuration of the inter-chip bridges 450C and 450E, because portion 410D is inactive in this example, the driver 605E does not receive data from the portion 410D. For example, the driver 605E may be disabled such that any data transmitted from the circuitry in the portion 410D cannot reach the other portions 410. Or the chips 405 may include e-fuses that may be blown after testing to disable the desired portions.

As shown in FIG. 4B, the portion 410G transmits data to the portion 410E. As such, the data received at a driver 605I in the inter-chip bridge 450E is transmitted through a driver 605J (which is enabled), through a TSV 610C, and is received at a mux 615B in the inter-chip bridge 450C. The SELECT signal is set so that the mux 615B outputs the data received from the inter-chip bridge 450E (and the portion 410G) to a driver 605H which in turn outputs the data to the portion 410E. Thus, the circuitry in the inter-chip bridges 450C and 450E work together so that data can be transmitted between portions 410 in two different chips 405. In this example, the portions 410D and 410H do not transmit or receive data via the inter-chip bridges 450C and 450E. As a result, some of the circuitry in these bridges 450C and 450E may be unused such as the drivers 605E, 605F, 605G, 605K, and 605L as well as the mux 615C. Moreover, the TSV 610D may also not be used although in some embodiments the TSV 610D may be used to communicatively couple the chip 405C to a lower substrate (if the stack includes an interposer (which is optional) or an I/O device or memory).

Although FIG. 6 illustrates single TSVs 610, these can represent multiple vias or singular vias. In one embodiment, the TSVs 610 extend through the respective chips 405 to form a continuous piece of conductive material. In another example, the TSVs 610 can be segmented such that there is an active driver between the TSVs 610. In one embodiment, the chips 405 can include vias that do not extend through the chips 405 for interconnecting the chips 405 and the inter-chip bridges 450.

FIG. 7 is a flowchart of a method 700 for forming 3D stacked devices with a redundant layer, according to one embodiment. At block 705, multiple wafers are formed that each include a plurality of chips. For example, each circular wafer can include tens or hundreds of different chips.

At block 710, the wafers are bonded together in a stack. That is, the wafers can be aligned such that a chip in the top wafer overlaps, and aligns with, a corresponding chip in the next wafer, and so forth. For example, solder bumps may be used to physically and communicatively couple the wafers together such that the chips in the different wafers can communicate. As discussed above, these solder bumps or connections can be used as part of the vertical communication paths 415 and the paths used by the inter-chip bridges 450 to establish communication between portions in different chips 405 as shown in FIG. 4B.

At block 715, the bonded wafers are separated to form multiple 3D stacked devices. For example, the bonded wafers can be sawed or cut along the boundary between each of the chips in the wafers. Doing so results in multiple 3D stacked devices which each includes a column of stacked chips as shown in FIGS. 1-4B. As discussed above, the chips can be logical divided to form one or more of the slivers.

At block 720, the chips in each of the 3D stacked devices are tested to identify nonfunctional portions. In one embodiment, so long as one chip includes a nonfunctional portion, a portion from each sliver is deactivated. For example, if only portion is nonfunctional, the system may nonetheless select portions from the other slivers (which may be functional and passed the test) to deactivate. Selecting which of the functional portions in a sliver to deactivate is discussed in FIG. 8. However, in other embodiments, it may be possible to deactivate only the nonfunctional portions such that some slivers may contain only active portions.

At block 725, the method 700 determines whether there is a sliver that includes more than one nonfunctional portion. That is, after reviewing the testing results, a testing apparatus or engineer can determine whether two or more portions in the same sliver (which would be on different chips) are nonfunctional. If so, the method 700 proceeds to block 730 where the 3D stacked device is labeled as non-compliant. For example, the 3D stacked devices may be guaranteed or advertised to have N+1 redundancy where each sliver includes an extra portion such the 3D stacked device can function as an 3D stacked device with N fully functional chips. However, if a device with N+1 redundancy has a sliver with two or more nonfunctional portions, than the device cannot function like it has N fully function chips. In one embodiment, the non-compliant device may be discarded. However, the device could be relabeled and sold as a different product. For example, if a 3D stacked device has three chips, but has a sliver with two nonfunctional portions but every sliver has at least one functional portion, it may be possible (depending on where the nonfunctional portions are disposed in the sliver) to form one functional chip from the portions. Thus, the 3D stacked device could be sold as a 3D stacked device with the logical equivalent of one fully functional chip. In another example, a four chip 3D stacked device may have two defective portions in the same sliver. In this scenario, the four layer device could be sold as a two logical layered device or a one logical layered device (depending on which of the portions in the slivers are defective). That is, the inactive or unused portions in neighboring slivers may permit the four layered device to have two logical layers, but in other examples, there may not enough connections to different layers (e.g., the TSVs between the layers) to permit the four layer device to be configured as a two logical layered device. In this example, the four layer device can be sold as a one logical layered device.

However, if none of the slivers contain two or more nonfunctional portions, the method 700 proceeds to block 735 where the inter-chip bridges are configured to avoid the nonfunctional (and deactivated) portions. For example, using e-fuses and/or drivers in the inter-chip bridges, the functional portions in the slivers can be interconnected as shown in, e.g., FIG. 4B. In this manner, the remaining functional (i.e., active) in the slivers can be interconnected to form, e.g., the logical chips shown in FIG. 5.

FIG. 8 is a flowchart of a method 800 for configuring the inter-chip bridges in the chips of a 3D stacked device, according to one embodiment. In one embodiment, the method 800 begins after block 725 where the chips in a 3D stacked device have been tested and none of the slivers have more than one nonfunctional portion. However, because not all of the slivers may include a nonfunctional portion, the method 800 can be used to select which of the portions in the sliver to deactivate in embodiments where a portion is deactivated in each sliver even if the deactivated portion is functional.

At block 805, one sliver in the 3D stack of chips is selected. In one embodiment, the method 800 forms a loop for evaluating each of the slivers in a 3D stacked device to determine which portion in the sliver to deactivate.

At block 810, the method 800 determines whether the sliver currently being evaluated contains a nonfunctional portion using the testing data. If so, the method 800 proceeds to block 810 where the inter-chip bridges bordering the selected sliver are configured to avoid the nonfunctional portion. Put differently, if the sliver contains a nonfunctional portion, by default, that portion is selected for deactivation.

The method 800 then proceeds to block 825 to determine whether there are more slivers in the 3D stacked device to evaluate. If so, the method 800 selects a different sliver (which has not previously been evaluated) and returns to block 810 where the method 800 again determines whether the currently selected sliver contains a nonfunctional portion. If not (i.e., all the portions in the sliver passed the test or tests), the method 800 proceeds to block 815 where the method 800 evaluates performance parameters for the functional portions in the sliver. For example, when testing the chips, the testing program may determine performance parameters for the respective portions in the chips such as power consumption, data throughput, signal noise, and the like. At block 815, these performance parameters can be evaluated to rank or prioritize the portions in the sliver. For example, a weighting algorithm can be used to evaluate the various performance parameters for each portion and assign a score to the portions. The portions in the sliver can be ranked using the scores. However, there are many different ways for evaluating the performance parameters in order to rank the portions.

At block 820, the inter-chip bridges bordering the sliver are configured to avoid the portion with the worst performance. That is, based on the evaluating the performance parameters, the worst performing portion in the sliver is selected and deactivated. For example, the worst performing portion may be the portion with the lowest static power. In one embodiment, assuming all the portions in the sliver are all operational, the method 800 selects the layer set resulting in the minimums static power configuration. The inter-chip bridges can then be configured to route data around the deactivated portion in the sliver.

At block 825, the method 800 determines whether there are remaining slivers in the 3D stacked device to be evaluated. If not, the method 800 ends.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A 3D stacked device, comprising:
a plurality of semiconductor chips stacked vertically on each other, wherein each of the plurality of chips is logically divided into the same of number of portions, wherein each of the portions in the same chip is separated from a neighboring portion by an inter-chip bridge,
wherein a respective portion from each of the plurality of chips in a column are grouped together to form a first sliver, wherein the respective portions in the first sliver comprise a deactivated portion and a first active portion,
wherein at least one inter-chip bridge bordering the first sliver is configured to route data from a second active portion in a neighboring sliver to the first active portion in the first sliver, wherein the second active portion is in the same chip as the deactivated portion but in a different chip from the first active portion.

2. The 3D stacked device of claim 1, wherein the neighboring sliver comprises a different deactivated portion, wherein at least one inter-chip bridge bordering the neighboring sliver is configured to route data around the different deactivated portion, and wherein the first sliver and the neighboring sliver have at most one deactivated portion.

3. The 3D stacked device of claim 1, wherein the respective portions in the first sliver have identical circuitry.

4. The 3D stacked device of claim 3, wherein the respective portions in the first sliver have identical circuitry as the portions in the neighboring sliver.

5. The 3D stacked device of claim 3, wherein the respective portions in the first sliver have different circuitry as the portions in the neighboring sliver, wherein the portions in the neighboring sliver have identical circuitry.

6. The 3D stacked device of claim 1, wherein each of the inter-chip bridges comprises a via to a neighboring chip.

7. The 3D stacked device of claim 1, wherein the plurality of chips comprises at least three chips, wherein an inter-chip bridge in a middle chip of the plurality of chips includes a first connection to an upper chip, a second connection to an lower chip, and a third connection coupling together neighboring portions within the middle chip, wherein the inter-chip bridge in the middle chip is configured such that only one of the first, second, and third connections is operable to transmit data during operation of the 3D stacked device.

8. The 3D stacked device of claim 7, wherein the inter-chip bridge in the middle chip comprises a first driver for driving the first connection, a second driver for driving the second connection, and a multiplexer disposed on the third connection, wherein the inter-chip bridge in the middle chip is configured such that, during runtime, data flows through only one of the first and second drivers.

9. The 3D stacked device of claim 8, wherein the middle chip is configured such that, during runtime, data received from one of the lower chip and the upper chip flows through the multiplexer to one of neighboring portions within the middle chip.

10. A 3D stacked device, comprising:
a plurality of semiconductor chips stacked vertically on each other, wherein each of the plurality of chips is logically divided into the same of number of portions, wherein each of the portions in the same chip is separated from a neighboring portion by an inter-chip bridge,
wherein a respective portion from each of the plurality of chips in a first column are grouped together to form a first sliver and a respective portion from each of the plurality of chips in a second column are grouped together to form a second sliver that neighbors the first sliver, wherein the respective portions in the first sliver comprise a first deactivated portion and at least two active portions and the respective portions in the second sliver comprise a second deactivated portion and at least two active portions,
wherein at least two inter-chip bridges are configured to route data between the at least two active portions in the first and second slivers.

11. The 3D stacked device of claim 10, wherein at least one inter-chip bridge bordering the first and second slivers is configured to route data around the first deactivated portion, and wherein the first sliver and the second sliver have at most one deactivated portion.

12. The 3D stacked device of claim 10, wherein the respective portions in the first sliver have identical circuitry.

13. The 3D stacked device of claim 12, wherein the respective portions in the first sliver have identical circuitry as the portions in the second sliver.

14. The 3D stacked device of claim 12, wherein the respective portions in the first sliver have different circuitry as the portions in the second sliver, wherein the portions in the second sliver have identical circuitry.

15. The 3D stacked device of claim 10, wherein each of the inter-chip bridges comprises a via to a neighboring chip.

16. The 3D stacked device of claim 10, wherein the plurality of chips comprises at least three chips, wherein an inter-chip bridge in a middle chip of the plurality of chips includes a first connection to an upper chip, a second connection to an lower chip, and a third connection coupling together neighboring portions within the middle chip, wherein the inter-chip bridge in the middle chip is configured such that only one of the first, second, and third connections is operable to transmit data during operation of the 3D stacked device.

* * * * *